US007747220B2

(12) United States Patent
Edmonson et al.

(10) Patent No.: US 7,747,220 B2
(45) Date of Patent: Jun. 29, 2010

(54) WIRELESS COMMUNICATION SYSTEM USING SURFACE ACOUSTIC WAVE (SAW) SECOND HARMONIC TECHNIQUES

(75) Inventors: Peter J. Edmonson, Hamilton (CA); Colin K. Campbell, Ancaster (CA)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 11/863,330

(22) Filed: Sep. 28, 2007

(65) Prior Publication Data

US 2008/0020709 A1    Jan. 24, 2008

Related U.S. Application Data

(63) Continuation of application No. 10/946,420, filed on Sep. 21, 2004, now Pat. No. 7,292,822, which is a continuation of application No. 09/863,944, filed on May 23, 2001, now Pat. No. 6,825,794.

(60) Provisional application No. 60/209,152, filed on Jun. 2, 2000.

(51) Int. Cl.
*H04B 7/00* (2006.01)
*H04B 1/26* (2006.01)
*H04B 15/00* (2006.01)
*H04B 1/00* (2006.01)
*H03H 9/00* (2006.01)
*H04B 11/00* (2006.01)
*H04Q 5/22* (2006.01)

(52) U.S. Cl. ............... 455/41.2; 455/313; 375/151; 375/153; 333/150; 333/154; 333/193; 340/10.1

(58) Field of Classification Search ............... 455/41.2, 455/188, 313, 323; 342/60, 131–132, 145, 342/165–175, 195, 193; 375/147, 150–153, 375/316; 333/150, 154, 193; 340/10.1
See application file for complete search history.

(56) References Cited

U.S. PATENT DOCUMENTS 2,742,618 A    4/1956   Weber (Continued)

FOREIGN PATENT DOCUMENTS

DE    196 38 370 A1    9/1996

(Continued)

OTHER PUBLICATIONS

Sato, T. et al.: "Experimental Investigation on the Operation of SAW Devices at Harmonic Frequencies with Stepped-Finger Interdigital Transducer," Proceedings of 1996 IEEE Ultrasonics Symposium; pp. 267-270; IEEE Publication 0-7803-3615-1/96.*

(Continued)

*Primary Examiner*—Nay A Maung
*Assistant Examiner*—Andrew Wendell
(74) *Attorney, Agent, or Firm*—Jones Day; Krishna K. Pathiyal; Robert C. Liang

(57) ABSTRACT

An IDT produces a SAW when excited by a single electrical pulse and can be fabricated to embody a code, which code provides for a passive autocorrelation of a SAW input to the IDT and thereby lends itself to further application as a signal generator in a communication device. However, internal dimensions of IDTs are inversely proportional to operating frequency, such that high frequency IDTs present significant manufacturing difficulties. Fabrication of IDTs for high frequency applications is simplified by exploiting a harmonic frequency SAW generated by IDTs. An IDT may therefore be designed according to fundamental frequency internal dimension criteria but can operate at a multiple of the fundamental frequency, thereby providing much higher frequency operation than conventional SAW systems. Operation of a second harmonic SAW system at 2.4 GHz based on a fundamental frequency of 1.2 GHz is contemplated.

10 Claims, 9 Drawing Sheets

U.S. PATENT DOCUMENTS

| | | | |
|---|---|---|---|
| 2,745,067 A | | 5/1956 | True et al. |
| 3,681,579 A | * | 8/1972 | Schweitzer ................ 708/426 |
| 4,015,223 A | | 3/1977 | Cheze |
| 4,137,497 A | * | 1/1979 | Lowenschuss ........... 324/76.68 |
| 4,206,380 A | * | 6/1980 | Hazama et al. .......... 310/313 B |
| 4,210,900 A | * | 7/1980 | Shavit ....................... 235/382 |
| 4,247,903 A | | 1/1981 | Grudkowski et al. |
| 4,249,146 A | * | 2/1981 | Yen et al. .................... 333/195 |
| 4,405,874 A | * | 9/1983 | Suthers ................... 310/313 B |
| 4,464,597 A | * | 8/1984 | Setsune .................. 310/313 B |
| 4,612,669 A | | 9/1986 | Nossen |
| 4,737,790 A | | 4/1988 | Skeie et al. |
| 4,746,830 A | | 5/1988 | Holland |
| 5,170,500 A | | 12/1992 | Broderick |
| 5,187,454 A | | 2/1993 | Collins et al. |
| 5,438,306 A | * | 8/1995 | Yamanouchi et al. ... 310/313 B |
| 5,459,440 A | | 10/1995 | Claridge et al. |
| 5,564,086 A | | 10/1996 | Cygan et al. |
| 5,568,002 A | | 10/1996 | Kawakatsu et al. |
| 5,631,611 A | | 5/1997 | Luu |
| 5,778,308 A | | 7/1998 | Sroka et al. |
| 5,790,000 A | | 8/1998 | Dai et al. |
| 5,815,055 A | * | 9/1998 | Eguchi et al. ............... 333/193 |
| 5,835,990 A | | 11/1998 | Saw et al. |
| 5,889,252 A | | 3/1999 | Williams et al. |
| 5,905,324 A | * | 5/1999 | Shiba et al. ............. 310/313 B |
| 6,255,915 B1 | | 7/2001 | Edmonson |
| 6,462,698 B2 | | 10/2002 | Campbell et al. |
| 6,535,545 B1 | * | 3/2003 | Ben-Bassat et al. ......... 375/142 |
| 6,570,462 B2 | * | 5/2003 | Edmonson et al. ......... 333/17.3 |
| 6,664,708 B2 | * | 12/2003 | Shlimak et al. ......... 310/313 R |
| 6,717,983 B1 | * | 4/2004 | Toda ........................... 375/222 |
| 6,759,789 B2 | * | 7/2004 | Hartmann ............... 310/313 D |
| 6,788,204 B1 | * | 9/2004 | Ianelli et al. ................ 340/572.1 |
| 6,967,428 B2 | * | 11/2005 | Edmonson et al. ...... 310/313 D |
| 2005/0121999 A1 | * | 6/2005 | Edmonson et al. ...... 310/313 D |
| 2006/0075820 A1 | * | 4/2006 | Cobianu et al. ............... 73/703 |
| 2007/0119257 A1 | * | 5/2007 | Hayasaka et al. ............. 73/649 |
| 2008/0129144 A1 | * | 6/2008 | Bechhoefer ............. 310/313 D |
| 2009/0206844 A1 | * | 8/2009 | Sabah et al. ................. 324/636 |
| 2009/0267761 A1 | * | 10/2009 | Georgescu et al. .......... 340/540 |

FOREIGN PATENT DOCUMENTS

| | | |
|---|---|---|
| DE | 197 24 258 A1 | 12/1998 |
| EP | 0 047 354 A | 3/1982 |
| EP | 0 797 315 A2 | 9/1997 |
| EP | 0 800 270 A2 | 10/1997 |
| EP | 0 872 954 A1 | 10/1998 |
| JP | 9-162757 | 6/1997 |
| JP | 11-88201 | 3/1999 |

OTHER PUBLICATIONS

Endoh, G. et al.: "High Performance Balanced Type SAW Filters in the Range of 900 MHz and 1.9GHz," IEEE Ultrasonics Symposium, New York, USA, Oct. 5, 1997, pp. 41-44 (XP-000848455).

Edmonson, P. et al.: "Radiation Conductance and Grating Reflectivity Weighting Parameters for Dual Mode Leaky-SAW Resonator Filter Design," Department of Electrical and Computer Engineering, McMaster University, Hamilton, Canada, 1994 Ultrasonics Symposium, pp. 75-79.

Edmonson, P.: "Coupling-Of-Modes Studies of Surface Acoustic Wave Oscillators and Devices," A Thesis Submitted to the School of Graduate Studies in Partial Fulfilment of Requirements for the Degree of Doctor of Philosophy, McMaster University, Feb. 1995, pp. 19, 83.

Saw, et al.: "Improved Design of Single-Phase Unidirectional Transducers for Low-Loss Saw Filters," Proceedings of the Ultrasonics Symposium, Denver, Oct. 14-16, 1987, New York, US, IEEE, vol. 1, 1987, pp. 169-172 (XP 000570867).

Huegli, R.: "GHz Filters with Third Harmonic Unidirectional Transducers," Proceedings of 1990 Ultrasonics Symposium, pp. 165-168, IEEE Publication 1051-0117/90/0000-0165 (XP 002185586).

Fleischmann, B. et al.: "Higher Harmonic Surface Transverse Wave Filters," Proceedings of 1989 Ultrasonics Symposium; pp. 235-239; IEEE Publication 0090-5607/89/0000-0235.

Dill, R. at al.: "GHz Low-Loss Filters on LITAO3 Operating at Higher Harmonics," Proceedings of 1989 Ultrasonics Symposium; pp. 251-254; IEEE Publication 0090-5607/89/0000-0251.

Huegli, R.: "Harmonic GHz Surface-Acoustic-Wave Filters with Unidirectional Transducers," IEEE Transactions on Ultrasonics, Ferroelectrics, and Frequency Control; vol. 40, No. 3, May 1993; pp. 177-182; IEEE Publication 0885-3010/93.

Hines, J. et al.: "A High Frequency SAW Device Transducer Structure Using Conventional Manufacturing Processes," Proceedings of 1994 Ultrasonics Symposium; pp. 93-97; IEEE Publication 1051-0117/94/0000-0093.

Sato, T. at al.: "Experimental Investigation on the Operation of SAW Devices at Harmonic Frequencies with Stepped-Finger Interdigital Transducer," Proceedings of 1996 IEEE Ultrasonics Symposium; pp. 267-270; IEEE Publication 0-7803-3615-1/96.

Hode, J. et al.: "Application of Low Loss S.A.W. Filters to RF and IF Filtering in Digital Cellular Radio Systems," Proceedings of 1990 IEEE Ultrasonics Symposium; pp. 429-434; IEEE Publication 1051- 0117/90/0000-0429 (XP-000290093).

Takehara, K.: "A SAW-Based Spread Spectrum Wireless LAN System," IEICE Transactions on Communications, E76-B Aug. 1993, No. 8, Tokyo, Japan, pp. 990-995 (XP-000396903).

Hikita, M. et al.: "A Wideband SAW Resonator and Its Application to a VCO for Mobile Radio Transceivers," 8105 IEEE Transactions on Vehicular Technology, 43 Nov. 1994, No. 4, New York, US, pp. 863-869 (XP-000493417).

PCT/CA00/00547 International Search Report, Sep. 13, 2000, 4 pgs.

* cited by examiner

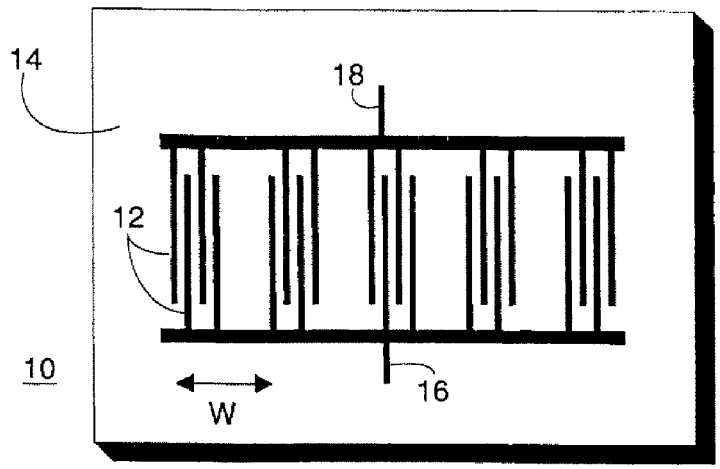
FIG. 1 - PRIOR ART
FIG. 3 PRIOR ART
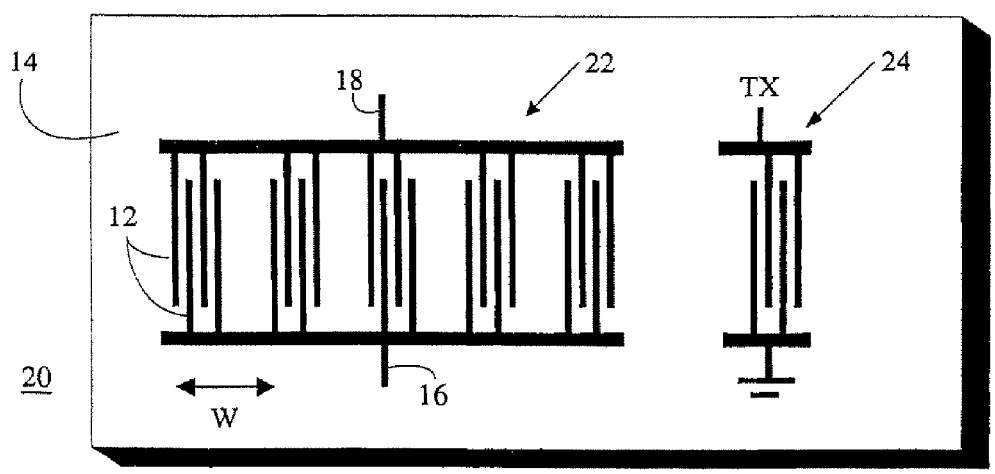
FIG. 2 - PRIOR ART

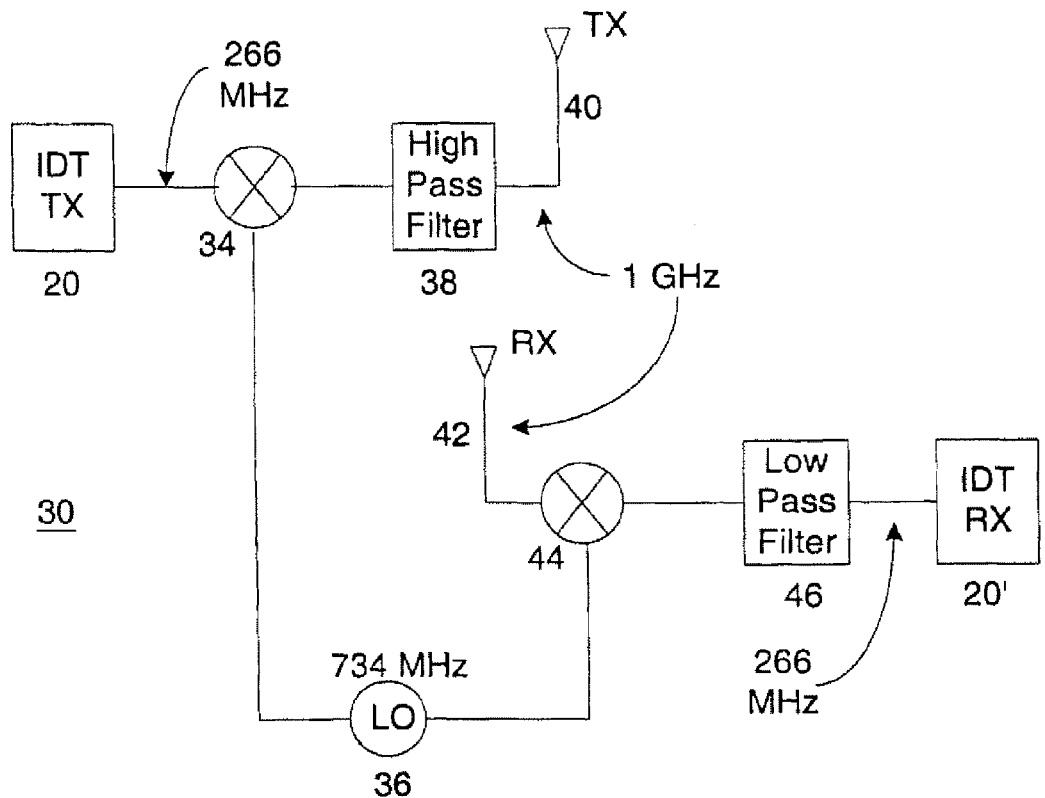
FIG. 4 - PRIOR ART
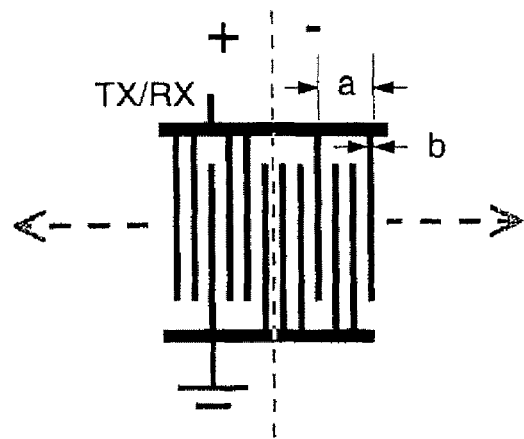
FIG. 5

WIRELESS COMMUNICATION SYSTEM USING SURFACE ACOUSTIC WAVE (SAW) SECOND HARMONIC TECHNIQUES

REFERENCE TO RELATED PATENT

This application is a continuation of U.S. patent application Ser. No. 10/946,420, filed on Sep. 21, 2004 now U.S. Pat. No. 7,292,822, which is a continuation of application Ser. No. 09/863,944, now U.S. Pat. No. 6,825,794, filed on May 23, 2001, which claims priority from U.S. Provisional Patent Application No. 60/209,152, filed on Jun. 2, 2000.

BACKGROUND OF THE INVENTION

1. Field of the Invention

This invention relates to short range communications using surface acoustic wave (SAW) expanders and compressors.

2. Description of the Prior Art

SAW technology is well known for its excellent radio frequency (RF) performance, low cost and small size. SAW is a passive thin film technology that does not require any bias current in order to function. SAW expanders and compressors have been used in RADAR applications for many years.

The basic "building block" of SAW expanders and compressors is the interdigital transducer (IDT) such as shown in FIG. 1. An IDT 10 is a series of thin metal strips or "fingers" 12 fabricated on a suitable piezoelectric substrate 14. One set of fingers is connected to an input/output terminal 16, while the opposite set of fingers is connected to another terminal 18. In single-ended IDTs, terminal 18 is grounded. For differential input signals however, terminal 18 is a pulse input/output terminal. Spacing "W" between IDT segments is adjusted to conform to the desired chip period of the coded sequence. When excited by a narrow pulse at terminal 16, the IDT generates a coded output SAW which propagates in both directions perpendicular to the fingers 12. If a similarly coded SAW impinges on the fingers 12, then an autocorrelation function is performed and a peak, with associated side lobes, is generated at terminal 16. These abilities of SAW expanders and compressors are well known in the prior art, having been demonstrated for example in Edmonson, Campbell and Yuen, "Study of SAW Pulse Compression using 5×5 Barker Codes with Quadraphase IDT Geometries", 1988 *Ultrasonics Symposium Proceedings*, Vol. 1, 2-5 Oct. 1988, pp. 219-222.

Thus the structure shown in FIG. 1 can operate as both a SAW expander, generating a SAW output from a single pulse input, and a SAW compressor, generating a single pulse or peak output from a SAW input. Terminal 16, as well as terminal 18 in differential IDTs, is both a pulse input terminal and a pulse output terminal. Conversion of an output SAW into an electrical signal for further processing in conventional communications circuits and subsequent transmission through an antenna is accomplished by adding a transmit IDT 24, aligned with the IDT 22, as shown in FIG. 2. Both IDTs can be fabricated on the same substrate 14. A SAW output from IDT 22 is converted into an electrical signal by TX IDT 24. A SAW receiver would have the same structure as in FIG. 2. A signal input to a receive IDT from receiver processing circuitry would be converted to a SAW which is input to IDT 22. Like the IDT 22, the TX IDT 24 may be a differential IDT, wherein the grounded lower terminal would be a pulse output terminal.

The geometry of adjacent IDT fingers 12 is shown in FIG. 3, where Tf is the width of a metallized finger 12 and Ts is the width of the space between the fingers 12. In typical designs both Tf and Ts are equal to a quarter of a wavelength, $\lambda/4$.

Since wavelength is inversely proportional to frequency of operation, higher frequency IDTs require thinner fingers 12 located in close proximity to each other, which complicates fabrication and reduces fabrication yields. For example, for a typical SAW system operating in the Industrial, Scientific and Medical (ISM) band at 2.4 GHz the $\lambda/4$ dimension could be in the order of 0.425 microns, depending upon the substrate chosen.

Previous communications system designs sought to overcome these manufacturing difficulties by using lower frequency SAW expanders and compressors having larger and further spaced fingers in conjunction with mixers and local oscillators, as shown in FIG. 4. In the typical prior art communication system 30, the lower frequency 266 MHz signal generated by transmit IDT 20 is up-converted in mixer 34, which receives a 734 MHz signal from local oscillator 36. The output from mixer 34 is filtered in high pass filter 38 to produce a 1 GHz signal which is transmitted through antenna 40. On the receive side, the process is reversed in antenna 42, mixer 44, low pass filter 46 and receive compressor IDT 20'. As discussed above, transmit IDT 20 and receive IDT 20' have similar structure. Undesirably, the mixers 34 and 44, oscillator 36 and filters 38 and 46 from the communications system 30, result in additional cost, power consumption, occupation in space and a much complex system than is desired for low-cost, low power, short range communication systems. Therefore, there remains a need in the art to reduce the number of components in such a communication system.

High-frequency communication techniques involving more conventional non-SAW based circuits and systems also exist. Bluetooth™ wireless technology is one such prior art example. Bluetooth is a de facto standard, as well as a specification for small-form factor, low-cost, short range radio links between mobile PCs, mobile phones and other portable wireless devices. The current Bluetooth short range communications specification operates in the 2.4 GHz (ISM) band; however, in reality the technology for mobile communication devices involves undesirable high cost, substantial power consumption and relatively complex hardware.

SUMMARY OF THE INVENTION

It is an object of the present invention to overcome some of the drawbacks of the prior art.

It is also an object of the present invention to provide a low cost SAW-based communication method and system. As an illustrative example of the cost reduction, SAW devices utilized by the present invention for filtering at near-ISM band frequencies may cost approximately $1.00 each. In contrast, a comparable semiconductor Bluetooth solution may cost greater than $10.00.

It is a further object of the invention to provide SAW-based transmit and receive units which are easily manufactured. The manufacturing required for the present invention allows for SAW fabrication that utilizes simple, single layer photolithographic techniques.

Another object of the invention is to provide a low power SAW solution for short range communications. The SAW uses passive thin film technology and requires only a pulse to excite and produce an RF waveform. Likewise it can perform an autocorrelation function passively. This compares to prior SAW techniques which require frequency conversion circuitry such as mixers, filters and oscillators, and the complex Bluetooth techniques that require separate receive, transmit and processing circuitry. In mobile communication environments, power consumption and size are of primary importance.

A still further object of the invention is to provide a SAW-based communication arrangement which occupies minimal space. A complete SAW package in accordance with the invention is in the order of 3 mm×3 mm.

The inventive SAW system reduces manufacturing complexity and cost and increases production yields by exploiting second harmonic components produced by expander/compressor IDTs. This allows the IDTs to be fabricated with larger finger widths than would be required according to known IDT methods and devices.

In the invention, a wireless communication system comprises an expander/compressor interdigital transducer (IDT) which produces a surface acoustic wave (SAW) output comprising frequency components at a fundamental frequency and a plurality of harmonic frequencies when excited with an electric input signal and produces an electric output signal when excited by a SAW input at the fundamental frequency or one or more of the plurality of harmonic frequencies, a transmit IDT positioned adjacent to the expander/compressor IDT and switchably connected to an antenna, and a receive IDT positioned adjacent to the expander/compressor IDT and switchably connected to the antenna, wherein the transmit IDT and the receive IDT are configured to operate at one of the harmonic frequencies.

In accordance with another aspect of the invention, a communication system comprises an expander IDT configured to produce a SAW output having a fundamental frequency and a plurality of harmonic frequencies when excited with an electric input signal, a transmit IDT positioned adjacent to the expander IDT and connected to an antenna, a receive IDT connected to the antenna; and a compressor IDT positioned adjacent to the receive IDT and configured to produce an electric output signal when excited by a SAW input comprising the fundamental frequency or one or more the plurality of harmonic frequencies, wherein the transmit IDT and the receive IDT are configured to operate at one of the harmonic frequencies.

The transmit IDT converts a SAW into an electric signal for transmission via the antenna and the receive IDT converts an electric signal received via the antenna into a SAW. The fundamental frequency may be 1.2 GHz and the transmit IDT and receive IDT operate at the second harmonic frequency of 2.4 GHz. Wireless communication systems according to the invention may be installed in both a wireless mobile communication device and a wireless earpiece detachable therefrom, to provide for communication between the mobile device and the earpiece. In a further embodiment of the invention, a SAW-based wireless communication system is installed in a wireless mobile communication device, a wireless earpiece detachable therefrom and a holder for the mobile device connected to a personal computer (PC), to provide for communication between the device and the PC through the holder, the device and the earpiece, and the earpiece and the PC through the holder.

The electric input and output signals associated with any of the IDTs may be either unbalanced or differential signals.

An expander/compressor IDT, or an expander IDT and a compressor IDT are preferably configured to embody a code and thereby produce a coded SAW output when excited with an input electric pulse and an output electric pulse when excited by a coded SAW input. The code embodied by these IDTs may be a Barker code such as a 5-bit Barker code, and may be used for example to represent identification information for an article with which the wireless communication system is associated.

According to a further aspect of the invention, a passive wireless communication system comprises an antenna for receiving communication signals and converting the received communication signals into electric antenna output signals and converting electric antenna input signals into output communication signals and transmitting the output communication signals, a first IDT connected to the antenna and configured to produce first SAW outputs in response to the electric antenna output signals and to produce the antenna input signals in response to first SAW inputs, a second IDT positioned adjacent to the first IDT and configured to produce a second SAW output comprising frequency components at a fundamental frequency and a plurality of harmonic frequencies when excited with an electric signal and to produce an electric signal output when excited by a second SAW input at the fundamental frequency or one or more of the plurality of harmonic frequencies, and a termination circuit connected to the second IDT, wherein the first IDT is configured to operate at one of the harmonic frequencies, the termination circuit causes the second IDT to reflect a second SAW output toward the first IDT in response to each first SAW output produced by the first IDT, and the first IDT produces an antenna input signal in response to each reflected second SAW output from the second IDT. The second IDT in such a passive system may be configured to embody a code.

In a particular embodiment of this aspect of the invention, a passive wireless communication system further comprises a third IDT which is positioned between the first IDT and the second IDT and reflects a third SAW output toward the first IDT in response to the first SAW output produced by the first IDT, wherein the first IDT produces a second antenna input signal in response to the reflected second SAW output from the third IDT. The passive wireless communication system may also include a fourth IDT which is positioned adjacent to the second IDT on a side of the second IDT opposite to the third IDT and reflects a third SAW output toward the first IDT in response to the first SAW output produced by the first IDT, wherein the first IDT produces a third antenna input signal in response to the reflected third SAW output from the fourth IDT. When the passive wireless communication system includes a third IDT and/or fourth IDT, these IDTs are preferably configured to operate at one of the harmonic frequencies, which may be the same as the harmonic frequency at which the first IDT operates.

The third and fourth IDTs, like the second IDT, may be connected to a respective termination circuit. A termination circuit is preferably either an open circuit, a short circuit or a sensor circuit. The passive wireless system preferably receives communication signals from a remote interrogation system, and through operation of the IDTs and termination circuit, automatically and passively responds to the remote interrogation system.

An IDT which may be used in embodiments of the invention preferably comprises a pair of substantially parallel electrically conductive rails and one or more groups of interdigital elements, each group comprising a plurality of interdigital elements. Each interdigital element is connected to one of the rails and extends substantially perpendicular thereto toward the other rail. Any such IDT may be configured to embody a particular code as determined by a connection pattern of the interdigital elements in each group. A coded IDT performs a passive autocorrelation function on a SAW input based on the code to thereby produce an electric pulse output when the SAW input is similarly coded.

A SAW system according to the invention may be employed in the design of virtually any new short range wireless communication system, for example to enable communication between an earpiece unit and an associated mobile communications device, as described briefly above and in further detail below. The inventive systems may also replace RF signal generation circuitry in existing short range communications system, including for example "Bluetooth" systems. A further system in accordance with the invention may be employed in "smart" identification tag systems and remote interrogation systems such as inventory systems and meter reading/telemetry systems.

Further features of the invention will be described or will become apparent in the course of the following detailed description.

BRIEF DESCRIPTION OF THE DRAWINGS

In order that the invention may be more clearly understood, preferred embodiments thereof will now be described in detail by way of example, with reference to the accompanying drawings, in which:

FIG. 1 shows an IDT;

FIG. 2 is a block diagram of a conventional SAW-based transmit IDT;

FIG. 3 is an illustration of typical finger geometry in an IDT;

FIG. 4 is a block diagram of a prior art SAW-based communication system;

FIG. 5 is an IDT adapted for second harmonic operation;

DETAILED DESCRIPTION OF THE PREFERRED EMBODIMENT

As discussed above, the lithographic process to produce SAW devices at higher frequencies is difficult due to the very small finger width. At 2.4 GHz, the wavelength would be approximately 1.7 microns, requiring a finger width of 0.425 microns depending on the substrate chosen. This very small width will affect the overall yield of the fabrication process and will impact on the price of the devices.

A solution to this problem would be to fabricate the device to operate at 1.2 GHz to produce a wavelength of 3.4 microns using unique finger geometry and then take advantage of the second harmonic that the device will support. This will allow for a more relaxed lithographic process and increase production yield, as the lines are not as thin and are spaced farther from each other.

The use of second harmonic IDT geometries has been well know for several years, see for example CAMPBELL and EDMONSON, "Conductance Measurements on a Leaky SAW Harmonic One-Port Resonator", *IEEE Transactions on Ultrasonics, Ferroelectrics and Frequency Control*, Vol. 47, No. 1, January 2000, pp. 111-116, but has never been applied to expanders or compressors. FIG. 5 illustrates an example of the finger configuration for a second harmonic SAW device with 2 chips (+ and −). In FIG. 5 and subsequent drawings, the substrate 14 has been omitted for clarity, but it is to be understood that IDT structures may be fabricated on a common substrate.

As shown in FIG. 5, a so-called "three-finger" IDT, in which each of the four groups of fingers includes three fingers, is required for second harmonic operation. Corresponding fingers of each group are separated by a distance 'a' equal to fundamental wavelength $\lambda_0$. Each finger and space in this three-finger IDT therefore has a width 'b' of $\lambda_0/6$.

The two double fingers in each group start out at the left hand side of the IDT attached to the top rail, but beyond the centre line they are attached to the bottom rail. This indicates a 180° phase shift as what is derived from a + and − configuration. As stated above, the finger and space width of the second harmonic IDT is $\lambda_0/6$. For a 2.4 GHz second harmonic output, the fundamental frequency is 1.2 GHz, corresponding to a wavelength $\lambda_0$=3.4 microns. The required finger width will be $\lambda_0/6$=0.567 microns instead of the 0.425 microns finger width for a 2.4 GHz IDT. FIG. 5 shows a single-ended IDT with a grounded lower terminal, but a differential IDT design could also be employed.

Figure 6:
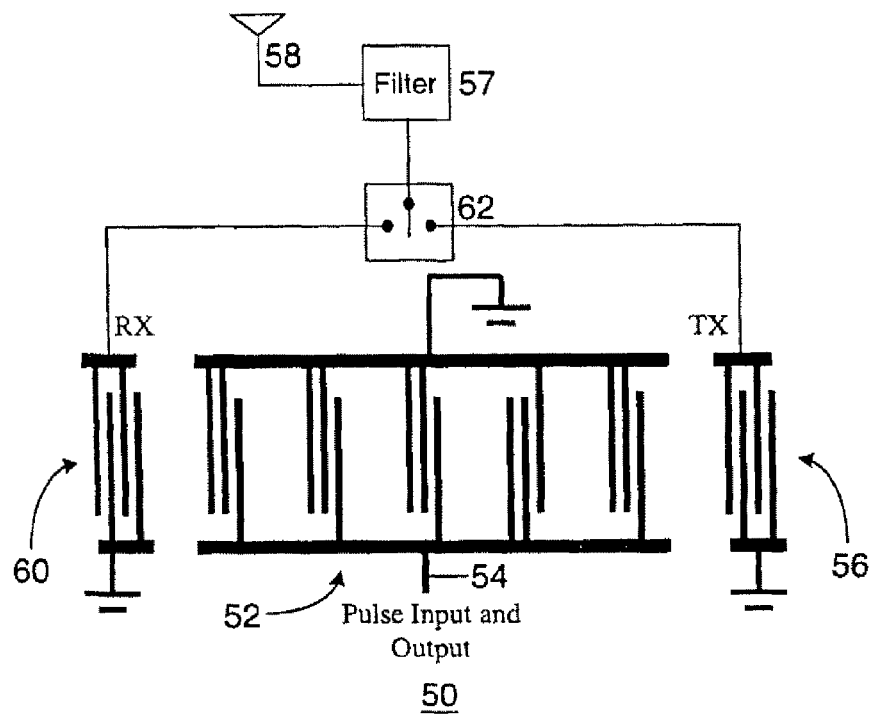
FIG. 6 shows a representation of a first embodiment of the invention.

According to a first preferred embodiment of the invention, with an IDT arrangement which can directly produce a high frequency output signal, a SAW-based communications system could comprise an expander/compressor IDT 52, a transmit (TX) IDT 56 and a receive (RX) IDT 60. These structures are in-line with each other as shown in FIG. 6. As discussed above in relation to FIG. 2, these structures may be placed on a suitable piezoelectric substrate using thin film lithographic procedures.

A narrow pulse which represents digital data and can be generated by using simple digital circuitry or an existing data source is injected into the middle IDT 52 of FIG. 6 through pulse input and output terminal 54 to activate a piezoelectric effect that converts electrical to mechanical (acoustic wave) motion. The acoustic waves can be coded depending on the geometry of the IDT 52. These acoustic waves then propagate within the substrate to the TX IDT 56. The coded acoustic waves are then transformed to an electrical coded RF signal within the proximity of the TX IDT 56. When the TX IDT 56 is attached to a suitable antenna 58 through the switch 62 and band pass filter 57, the coded RF signal can propagate throughout the air.

The same device can then perform in a similar reciprocal fashion. A coded electrical signal that enters the RX IDT 60 via the antenna 58, band pass filter 57 and switch 62 generates an acoustic wave that propagates towards the middle expander/compressor IDT 52. An autocorrelation function is passively performed in the IDT 52 and if the coded waveform from the RX IDT 60 matches with the code on the expander/compressor IDT 52, a peak is generated at the pulse input and output terminal 54.

Figure 7:
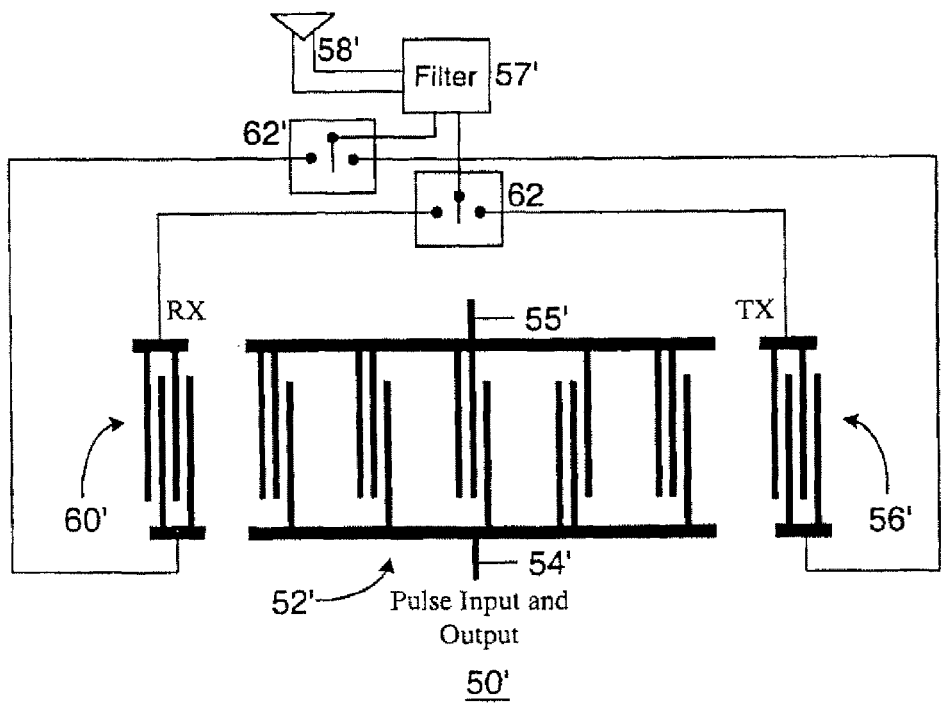
FIG. 7 is a differential implementation of the first embodiment.

As discussed above, any of the IDTs shown in FIG. 6 could be implemented as differential IDTs. A fully differential system is shown in FIG. 7. In comparison with the system of FIG. 6, all of the grounded terminals in FIG. 7 are pulse input and output terminals in FIG. 7. Although two switches 58 and 58' are shown, a single differential switching arrangement may be used. As indicated by the multiple connections in FIG. 7, the filter 61' and antenna 62' must also be differential components. Expander/compressor IDT 52' may be single-ended, with terminal 55' grounded as shown in FIG. 6, or differential, wherein terminal 55' is a pulse input and output terminal. The differential system in FIG. 7 operates similarly to the system of FIG. 6, as will be apparent to those skilled in the art.

The peak produced by an expander/compressor IDT such as 52 or 52' can represent digital data. For example, in accordance with an on-off keying technique, following an intialization or synchronization sequence, the presence of a peak within a bit period may be interpreted as a '1' data bit, whereas the absence of a peak would represent a '0' bit.

The coding of the expander/compressor IDTs 52, 52' and the associated autocorrelation function performed by the IDTs as discussed above are determined by the finger geometry of the IDT. A preferred IDT coding scheme is a Barker code. Barker codes are particularly useful for IDT coding, since they minimize the energy in the side lobes associated with a compressed pulse generated by the autocorrelation function performed on a SAW input to an expander/compressor IDT. In FIG. 6 for example, the expander/compressor IDT 52 embodies a 5 bit + + + − + Barker code.

Figure 8:
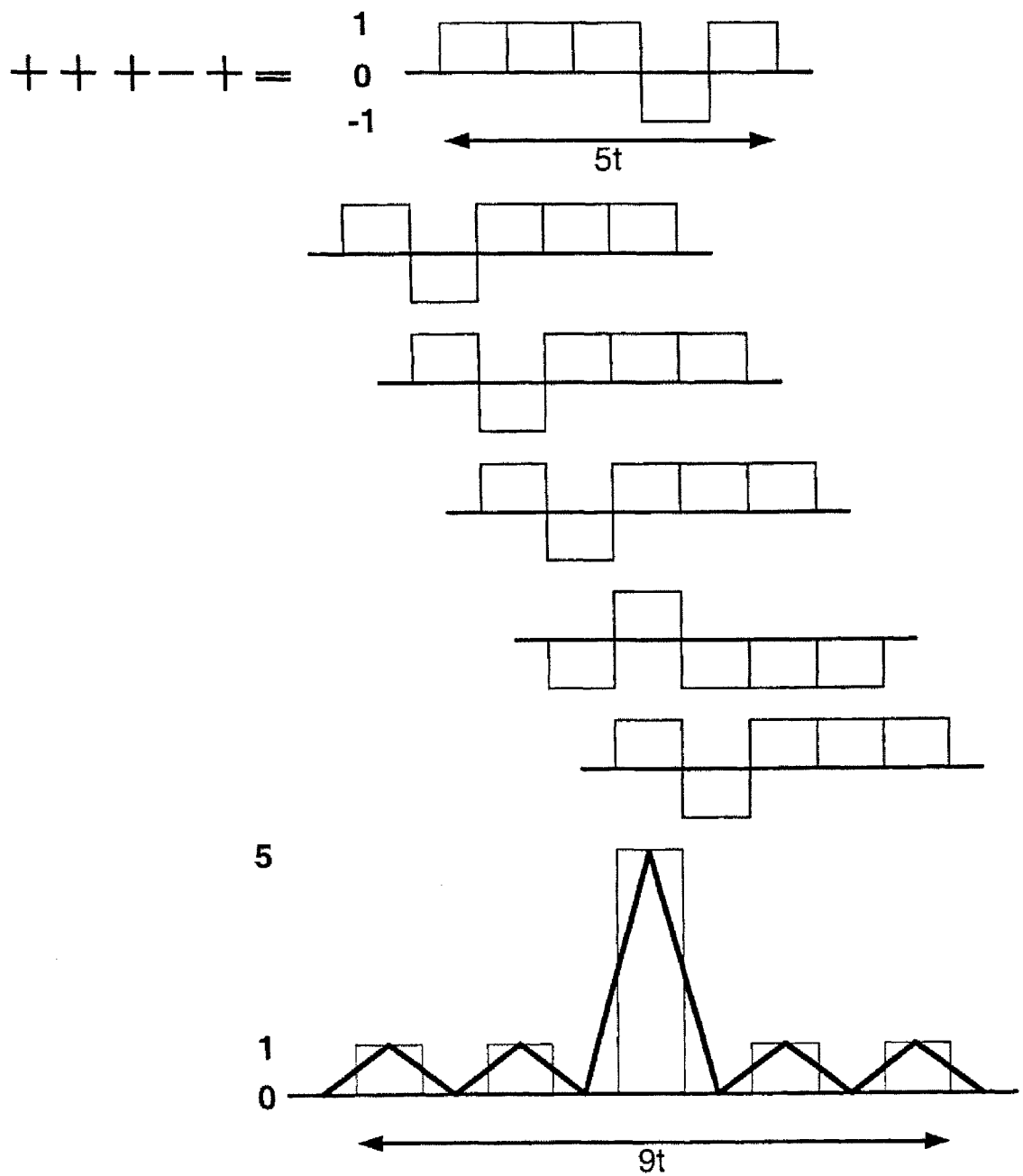
FIG. 8 illustrates an autocorrelation function of a 5 bit Barker code.

FIG. 8 shows an example of the autocorrelation function performed by the expander/compressor IDT 52 of FIG. 6 when a signal received through the antenna 58 and switch 62 is converted to a SAW by RX IDT 60. The autocorrelation function is mathematically equivalent to a series of shift and add operations as shown in FIG. 8 and generates the peak and associated side lobes shown at the bottom of FIG. 8. The amplitude of the autocorrelation peak is proportional to the code length N, which is 5 in the example shown in FIG. 8, whereas the side lobes are amplitude 1. This passive autocorrelation decodes received signals that were generated with an identically-coded IDT.

In the system of FIGS. 6 and 7, only the expander/compressor IDTs 52, 52' must be coded. As discussed above, Barker codes are preferred. Since the amplitude of the autocorrelation peak generated when a received signal is compressed by a Barker-coded expander/compressor IDT is dependent on the length N of the Barker code, higher-length codes are most preferred. For example, the maximum length known Barker code with N=13 (+ + + + + − − + + − + − +) will generate an autocorrelation waveform similar to that shown in FIG. 7, but having a peak of amplitude 13 and additional side lobes with amplitude 1.

Also evident from FIGS. 6 and 7 are the relative lengths of the RX IDTs 60, 60', the expander/compressor IDTs 52, 52' and TX IDTs 56, 56'. By far the longest IDTs, expander/compressor IDTs 52, 52', are fabricated with a finger width of 0.567 microns to facilitate second harmonic operation at 2.4 GHz. Only the shorter IDTs 56, 56', 60 and 60' must be fabricated for 2.4 GHz operation with the smaller finger width of 0.425 microns. Therefore, the more stringent manufacturing requirements apply only to the shorter elements, which will increase production yields. Fabrication of the shorter elements with thinner fingers is considerably less difficult than fabrication of the much longer expander/compressor IDT with the same finger width. Furthermore, the representations shown in the drawings are simplified views of expander/compressor IDTs. In reality, the IDTs 52, 52' will often comprise more than the single set of fingers shown in FIGS. 6 and 7 per code bit.

The antenna switch 62 in FIG. 6 and switches 62 and 62' in FIG. 7 are required to prevent feedback of a transmission signal from the TX IDTs 56 and 56' to the RX IDTs 60, 60', which would occur if both the TX and RX IDTs were connected to the antennas 58, 58'. Such feedback would cause the RX IDTs 60, 60' to convert the fed back signal to a SAW, which in turn would propagate through IDT 52, 52' and cause interference. Switches 62, 62' similarly prevent a received signal from feeding back through the TX IDT 56, 56'. However, small-scale switches of the type normally employed in such arrangements tend to be prone to failure. The switch and associated complex control circuits also occupy space and consume power. Such problems are critical concerns in highly integrated device designs and mobile communications equipment in which SAW systems according to the instant invention could be employed.

Figure 9:
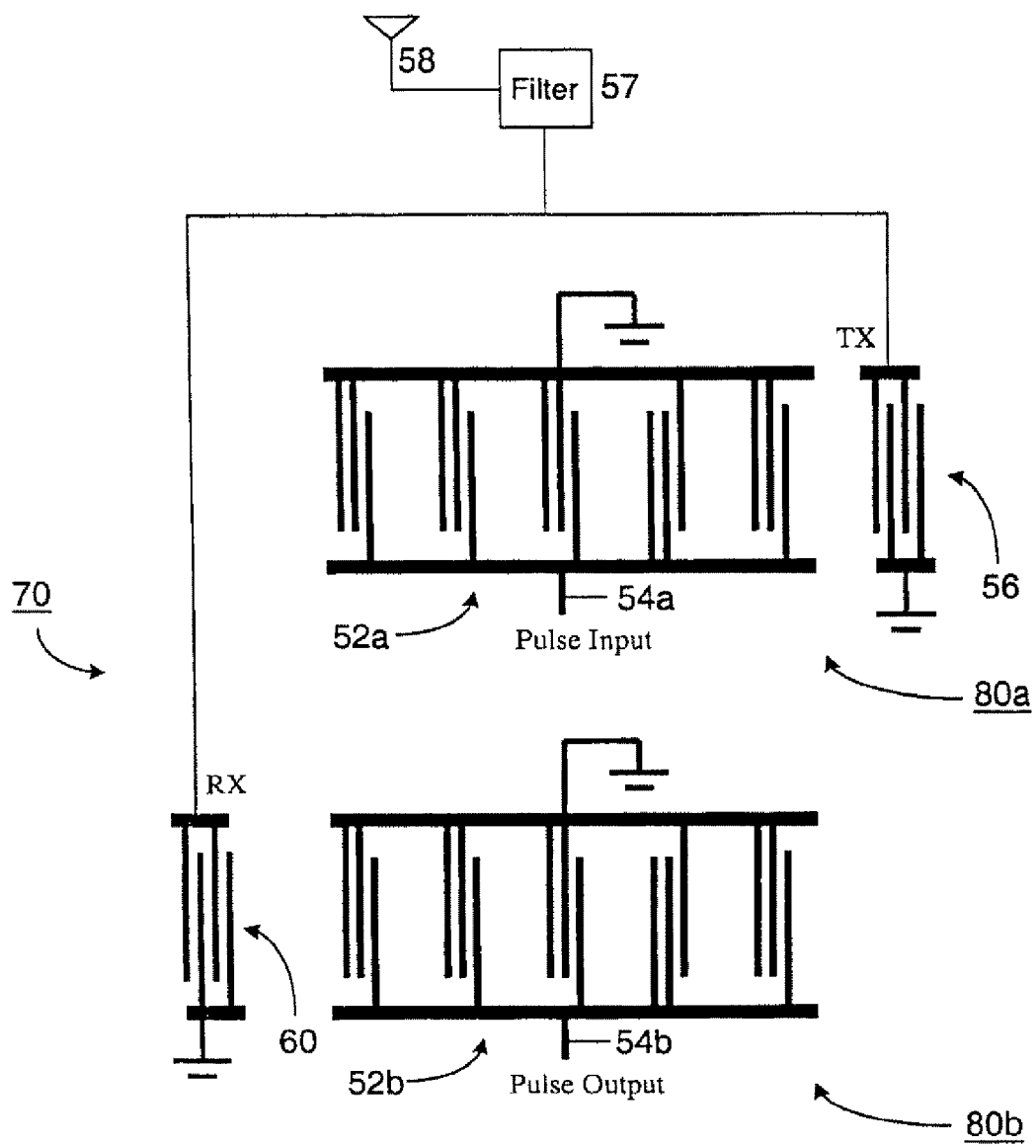
FIG. 9 is a second embodiment of the invention.

A second embodiment of the invention as shown in FIG. 9 eliminates the antenna switches and the problems associated therewith. According to the second embodiment, the SAW-based communication system 70 has an expander IDT 52a and a compressor IDT 52b. A pulse representing data input at terminal 54 is converted to a coded SAW by expander IDT 52a. Transmit IDT 56 then converts the resultant coded SAW into an electrical signal for transmission via band pass filter 57 and antenna 58. Feedback of the transmit signal to the RX IDT 60 does not interfere with the IDT 52a in the transmit module 80a. Pulse output 54b is not read during signal transmission to prevent erroneous data detection. A signal received at antenna 58 is filtered by band pass filter 57, input to RX IDT 60, converted to a SAW and decoded by autocorrelation in compressor IDT 52b provided the received signal code corresponds to the coding of IDT 52b. The autocorrelation peak is output at terminal 54b. Although the received signal is split between the TX IDT 56 and the RX IDT 60, the SAW generated at TX IDT 56 causes no interference with the receive module 80b. Any pulse output on terminal 54a during a receive operation is ignored.

The IDTs shown in FIG. 9 are similar in construction to those in FIG. 6. The expander IDT 52a and compressor IDT 52b are fabricated for second harmonic operation at 2.4 GHz and coded in the same way as IDT 52 of FIG. 6. TX IDT 56 and RX IDT 60 operate at a fundamental frequency of 2.4 GHz.

Figure 10:
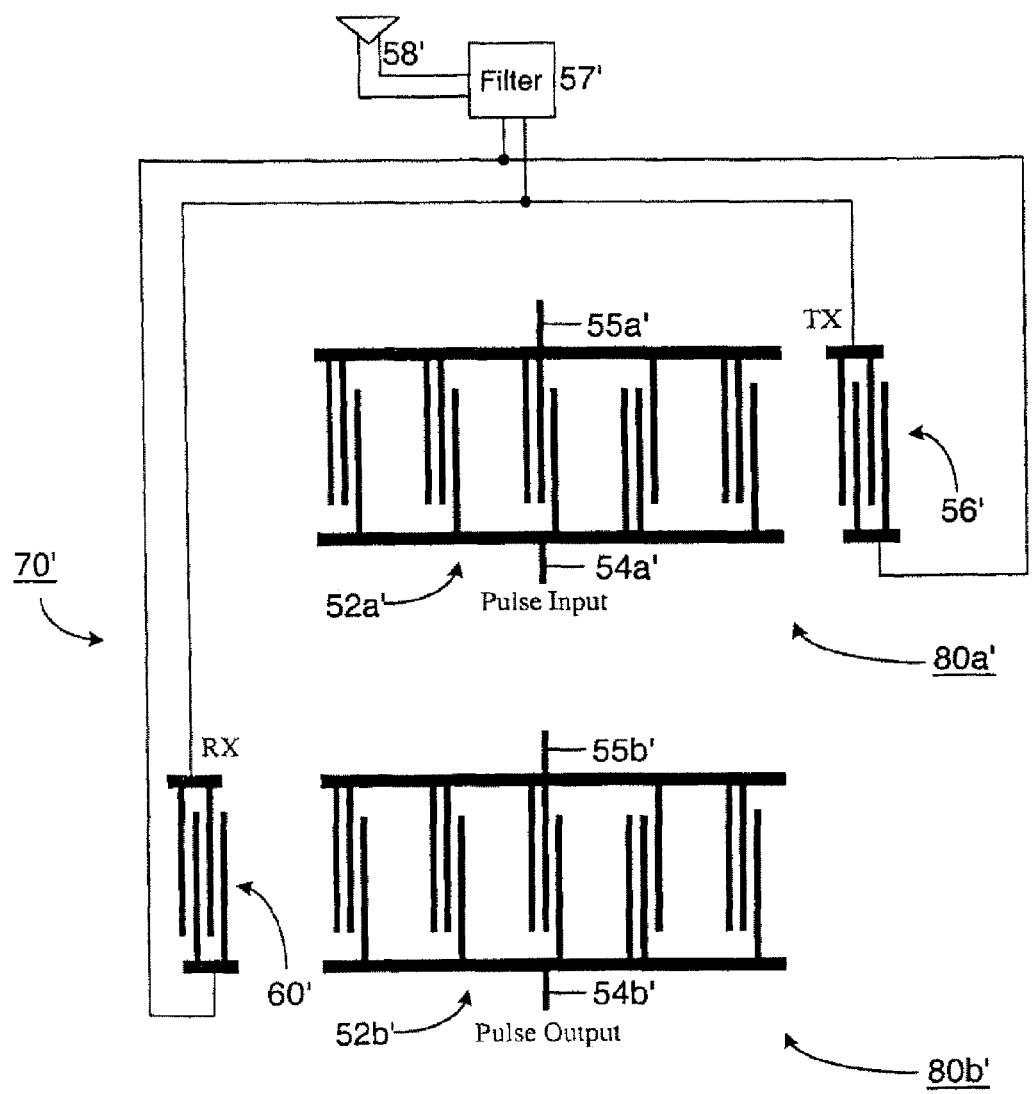
FIG. 10 is a differential implementation of the second embodiment.

Any of the IDTs in FIG. 9 may be differential IDTs, as shown in FIG. 10. In the differential arrangement, terminals of the TX IDT 56 and RX IDT 60 shown as grounded in FIG. 9 are pulse input or output terminals in FIG. 10. Although single-ended IDTs are preferred for the expander IDT 52a' and compressor IDT 52b', these IDTs may also be differential IDTs, in which case terminals 55a' and 55b' are connected as pulse input and output terminals, respectively, instead of to ground.

Although the problems associated with the antenna switches 62 and 62' of the first embodiment are eliminated in the second embodiment, transmit and receive signal splitting at the antenna result in signal power losses within the system. Any choice between the first and second embodiments trades off the relatively higher failure rates, control circuit complexity, size and power consumption of the first embodiment against the signal power losses of the second embodiment.

The arrangements disclosed above can reduce the cost, power consumption, size and complexity of virtually any short range communications system. This SAW based technology will allow communication devices to be placed in power sensitive applications such as a wireless earpiece to allow the user a longer "talk-time" over Bluetooth devices.

This invention may be incorporated into any situation for which Bluetooth was designed. An illustrative example of a system into which a system in accordance with the first or second embodiment could be incorporated is shown in FIG. 11.

Figure 11:
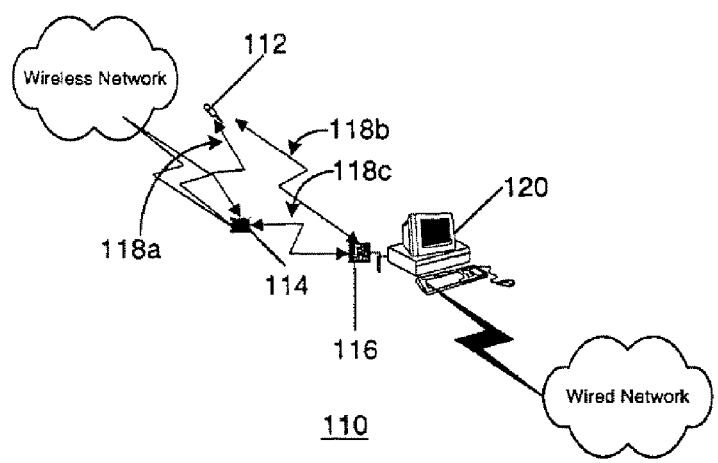
FIG. 11 represents a system in which the invention could be implemented.

One contemplated application of the invention is illustrated in FIG. 11, wherein 102 denotes an earpiece, 104 is a mobile wireless communication device and 106 is a holder or cradle for holding the device 104 and coupling device 104 to a personal computer (PC) 110. In system 100, the earpiece 102, device 104 and cradle 106 incorporate a SAW communication device as disclosed above. This allows a user to communicate audibly between the wireless communication device 104, which may for example be carried on their belt or person, and the wireless earpiece 102 with a built-in microphone, as indicated at 108a in FIG. 11. This system could be then expanded to include communication between the earpiece 102 and the personal computer 110, as indicated by 108b, when a SAW system in cradle 106 is attached to the PC via a bus connection. This system may then be further expanded to include network communications (designated 108c in FIG. 11) between the wireless device 104 on the belt or person with the PC 110 to incorporate connectivity via small pico-cell networks. A further extension of the communication systems according to the first and second embodiments could be a personal area network (PAN) based on SAW technology rather than the more excessive Bluetooth strategy.

Figure 12:
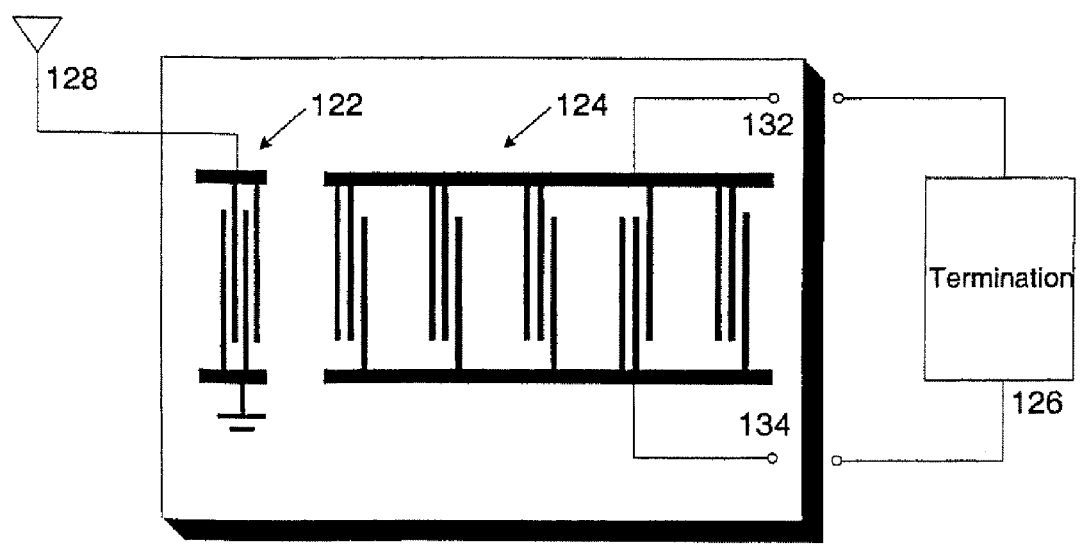
FIG. 12 illustrates a third embodiment of the invention.

In a third embodiment of the invention, the second harmonic design techniques discussed above are applied to passive SAW RF systems. In such systems, SAW devices usually perform only as RF expanders. As shown in FIG. 12, such a passive system 120 may comprise two IDTs 122 and 124. IDT 124 is fabricated according to fundamental frequency criteria, whereas IDT 122 operates at a harmonic of the fundamental, as discussed above. A pulse that has been sent out by a local requesting unit is received at the antenna 128 and excites IDT 122 to produce an acoustic wave. This wave then propagates to a coded IDT 124 that has a suitable termination 126 connected across its terminals 132 and 134 to produce a reflection coefficient of magnitude 1. Termination 126 could be an open or short circuit termination, which will re-excite the coded IDT 124 to produce a coded acoustic wave back to the IDT 122 that is connected to the antenna 128. The result is that an impulse sent out by a local requesting unit excites a coded IDT which then returns back to the requesting unit a coded RF waveform.

At the requesting unit, autocorrelation of the coded waveform returned from the device 120 would preferably be performed by a DSP or other conventional signal processing circuitry, such that different codes can be used for different IDTs such as IDT 124. In order for the requesting unit to passively perform the autocorrelation, a separate coded IDT must be provided in the requesting unit for each different code embodied in all devices 120 with which communication is desired. This would severely limit the number of devices 120 that could be deployed.

The size of the complete SAW device 120, as discussed above, could be on the order of 3 mm square. This would allow the device to be incorporated into labels such as shipping or address labels, equipment name plates, adhesive stickers such as vehicle license plate stickers and other forms of identification tags. The code embodied in the IDT 124 could for example be a code that provides information about an item to which the device 120 is attached. Device 120 could therefore be implemented in an identification or location system for example.

Figure 13:
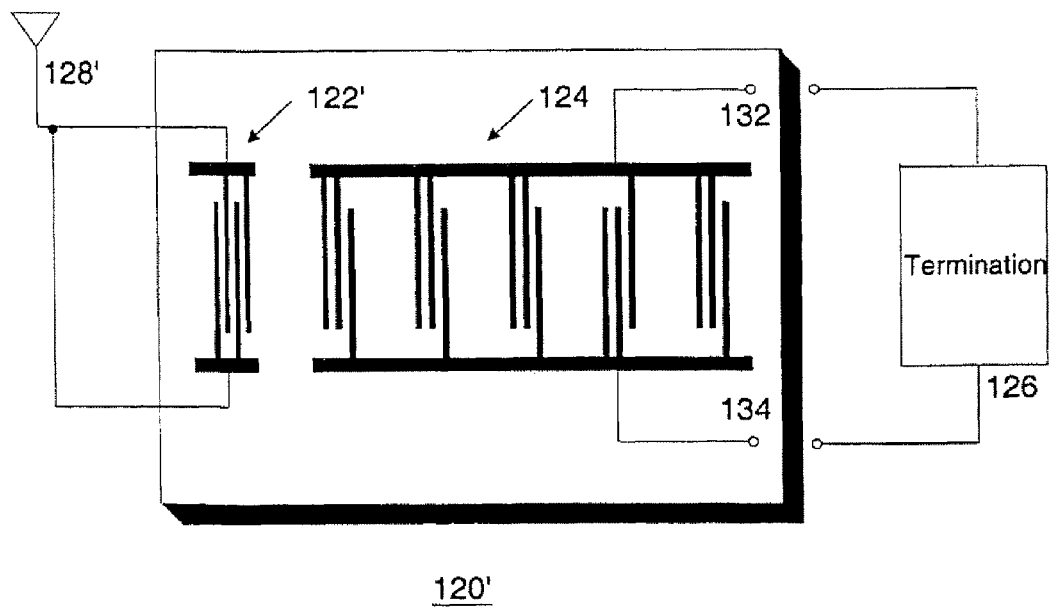
FIG. 13 is a differential implementation of the third embodiment.

Although IDT 122 in FIG. 12 is a single-ended IDT, a differential design is also contemplated, as shown in FIG. 13.

Figure 14:
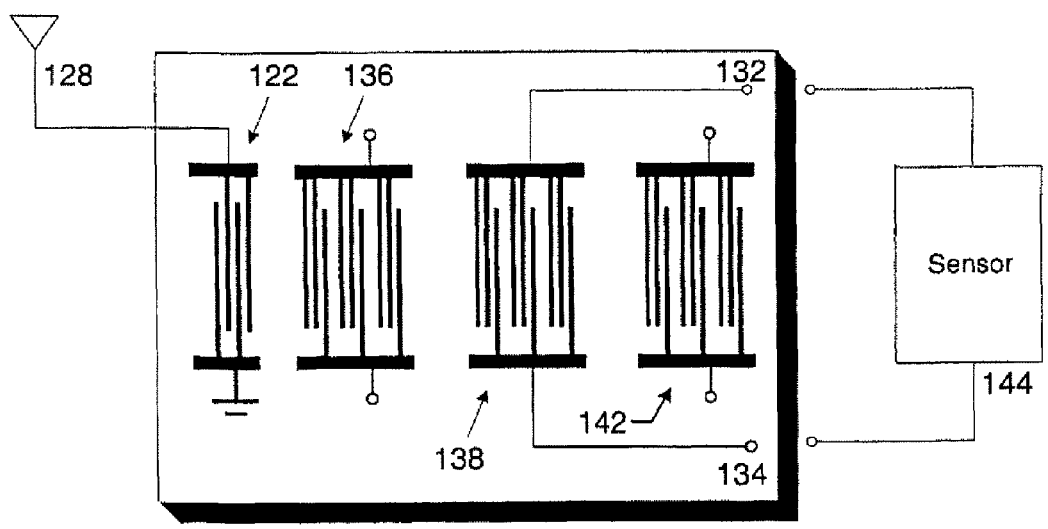
FIG. 14 shows a variation of the third embodiment.

In FIGS. 12 and 13, IDT 124 is shown as a coded IDT that produces a coded reflected SAW that can provide information to the requesting unit. However, in the systems of FIGS. 14 and 15, the IDTs are not coded. As shown in FIG. 14 for example, the passive communication system includes four IDTs, 122, 136, 138 and 142, of which IDTs 136, 138 and 142 are fabricated as fundamental frequency components. IDT 122 is fabricated for operation at a harmonic frequency of fundamental. The terminals of IDT 136 are either open circuited as in FIG. 14 or short circuited such that a SAW produced by IDT 122 in response to a pulse received from a requesting unit by antenna 128 is reflected back toward the IDT 122 by IDT 136. A return RF signal is therefore transmitted to the requesting unit as discussed above in relation to FIG. 12, although the return signal generated by device 130 is not coded. The terminals of IDT 142 are also either open or shorted, to thereby generate a second return signal to the requesting unit.

The middle IDT 138 is connected to a sensor 144, which may for example be a load impedance which changes according to a sensed characteristic or property such as moisture or temperature. A further reflected SAW, the magnitude and phase of which is dependent upon the impedance of the sensor 144, is generated by IDT 138 and results in a third RF return signal. The reflection characteristics and thus the magnitude and phase of the RF return signal generated by the so-called reference IDTs 136 and 142 are known, depending upon the open or short circuiting of the terminals. These reference return signals can be compared to the return signal generated by the IDT 138 to determine the state of sensor 144 and thereby the value of the measured characteristic or property.

Figure 15:
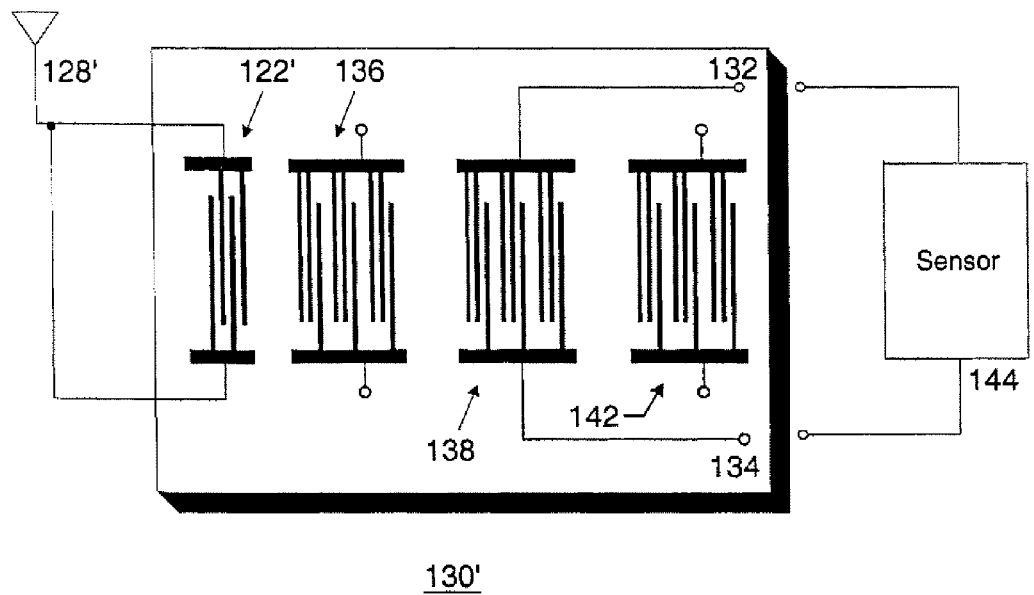
FIG. 15 is a differential implementation of the system of FIG. 14.

The device 130' shown in FIG. 15 is a fully differential realization of the device 130.

Figure 16:
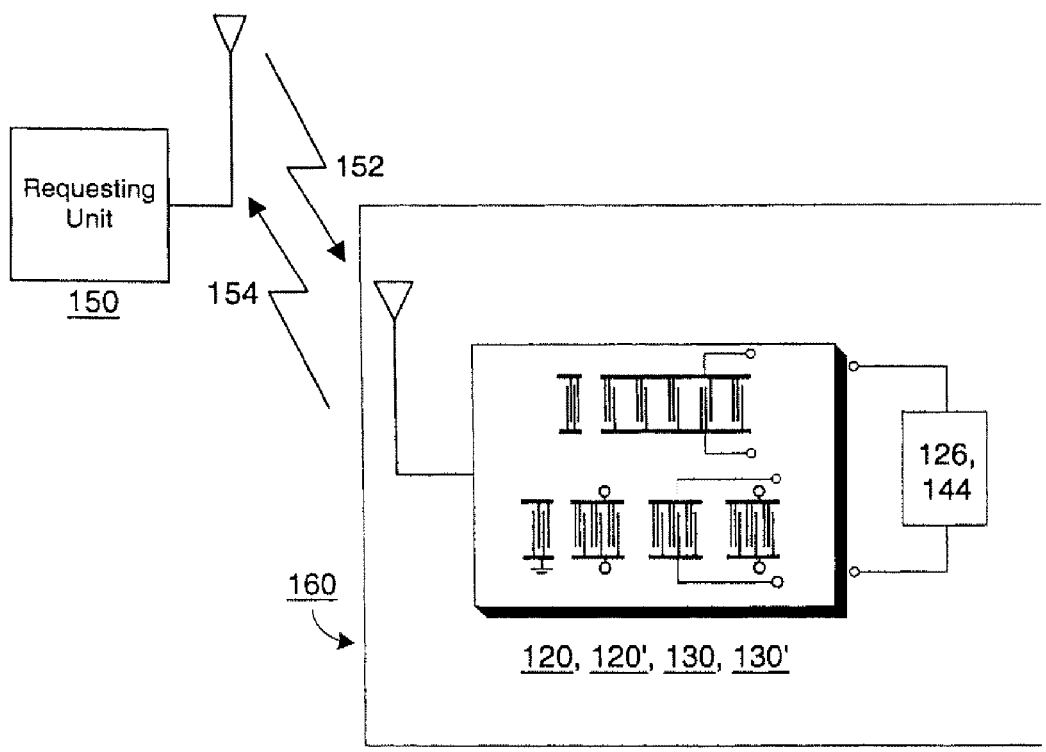
FIG. 16 is a block diagram of a system in which the third embodiment could be employed.

FIG. 16 shows a system into which passive SAW RF devices according to the third embodiment of the invention could be implemented. A requesting unit 150, which may for example be a hand-held unit with a display or part of a larger interrogation and tracking system, sends an RF pulse 152 to a label, tag or the like generally indicated at 160. The tag 160 includes a SAW device 120, 120', 130 or 130' and may be attached to or placed on or inside an item or at a location where measurement by sensor 144 is to be made. The return signals 154 generated by the SAW device in tag 160, are received at the requesting device. For a device 120 or 120', which produces a coded return signal 154, the return signal is processed to determine tag information. For sensor applications in which reference return signals and a sensor return signal are generated, the signals are compared to determine sensor information. The tag or sensor information thus determined may for example be displayed to a user or operator of the requesting device 150, forwarded from the requesting unit 150 to an information, tracking or billing system for further processing, or both.

It will be appreciated that the above description relates to the preferred embodiment by way of example only. Many variations on the invention will be obvious to those knowledgeable in the field, and such obvious variations are within the scope of the invention as described and claimed, whether or not expressly described.

What is claimed:

1. A system for encoding information on a passive surface acoustic wave device (SAW), comprising:
a requesting unit configured to wirelessly transmit an impulse signal; and
a SAW device having an interdigital transducer (IDT) that is configured to physically store coded data, the SAW device being configured to receive the impulse signal and in response to receiving the impulse signal, exciting the IDT to generate a coded signal that includes the stored coded data and that includes frequency components at a fundamental frequency;
wherein a second IDT is configured to receive the impulse signal and in response to receiving the impulse signal, being further configured to produce a first SAW output that includes frequency components at the fundamental frequency;

further comprising:

a termination circuit coupled to the IDT and configured to reflect the coded signal generated by the IDT; and wherein the IDT is excited by the first SAW output to generate the coded signal, and the termination circuit re-excites the IDT to generate a coded SAW output that includes the stored coded data.

2. The system of claim 1, wherein the coded SAW output includes frequency components at the fundamental frequency and a plurality of harmonic frequencies.

3. The system of claim 2, the second IDT being further configured to receive the coded SAW output and in response to receiving the coded SAW output, being further configured to generate a second coded signal that is transmitted by the antenna, the second coded signal including the stored coded data from the coded SAW output.

4. The system of claim 3, the requesting unit being further configured to receive and decode the second coded signal.

5. The system of claim 1, wherein the second IDT is a differential design.

6. A method of wireless communication, comprising:

receiving an impulse signal; and in response to receiving the impulse signal, exciting an interdigital transducer (IDT) to generate a coded signal that includes frequency components at a fundamental frequency, wherein the IDT is configured to physically store coded data, and wherein the stored coded data is included in to coded signal;

wherein a second IDT is configured to receive the impulse signal and in response to receiving the impulse signal, being further configured to produce a first SAW output that includes frequency components at the fundamental frequency;

wherein the IDT is excited by to first SAW output to generated to coded signal, to method further comprising:

reflecting the coded signal from the IDT using a termination circuit coupled to the IDT to re-exite the IDT to generate a coded SAW output that includes the stored coded data.

7. The method of claim 6, wherein the coded SAW output includes frequency components at the fundamental frequency and a plurality of harmonic frequencies.

8. The method of claim 7, the second IDT being further configured to receive the coded SAW output and in response to receiving the coded SAW output being further configured to generate a second coded signal that is transmitted by the antenna, the second coded signal including the stored coded data from the coded SAW output.

9. The method of claim 8, the requesting unit being further configured to receive and decode the second coded signal.

10. The method of claim 6, wherein the second IDT is a differential design.

* * * * *

UNITED STATES PATENT AND TRADEMARK OFFICE
CERTIFICATE OF CORRECTION

| | | |
|---|---|---|
| PATENT NO. | : 7,747,220 B2 | Page 1 of 1 |
| APPLICATION NO. | : 11/863330 | |
| DATED | : June 29, 2010 | |
| INVENTOR(S) | : Edmonson et al. | |

It is certified that error appears in the above-identified patent and that said Letters Patent is hereby corrected as shown below:

Column 12, line 2, please replace "data, and wherein the stored coded data is included in to" with
-- data, and wherein the stored coded data is included in the --

Column 12, line 9, please replace "wherein the IDT is excited by to first" with -- wherein the IDT is excited by the first --

Column 12, line 10, please replace "to coded signal, to method" with -- the coded signal, the method --

Column 12, line 20, please replace "to receiving the coded SAW output being further configured" with
-- to receiving the coded SAW output, being further configured --

Signed and Sealed this
Fourteenth Day of June, 2011

David J. Kappos
*Director of the United States Patent and Trademark Office*